US012688880B2

(12) United States Patent
Lee et al.

(10) Patent No.: US 12,688,880 B2
(45) Date of Patent: Jul. 21, 2026

(54) MEMORY DEVICE COMPRISING MEMORY CELLS STORING CALIBRATION DATA AND OPERATING METHOD THEREOF

(71) Applicant: Samsung Electronics Co., Ltd., Suwon-si (KR)

(72) Inventors: Chanho Lee, Suwon-si (KR); Junghak Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 83 days.

(21) Appl. No.: 18/754,774

(22) Filed: Jun. 26, 2024

(65) Prior Publication Data

US 2025/0014620 A1 Jan. 9, 2025

(30) Foreign Application Priority Data

Jul. 7, 2023 (KR) ........................ 10-2023-0088633
Nov. 9, 2023 (KR) ........................ 10-2023-0154567

(51) Int. Cl.
*G11C 11/16* (2006.01)

(52) U.S. Cl.
CPC ...... *G11C 11/1659* (2013.01); *G11C 11/1657* (2013.01); *G11C 11/1673* (2013.01); *G11C 2207/2254* (2013.01)

(58) Field of Classification Search
CPC .............. G11C 11/1673; G11C 11/161; G11C 11/1659; G11C 11/1697
See application file for complete search history.

(56) References Cited

U.S. PATENT DOCUMENTS

| | | | |
|---|---|---|---|
| 8,902,628 B2 | 12/2014 | Ha et al. | |
| 11,594,269 B2 | 2/2023 | Lee et al. | |
| 12,033,715 B2* | 7/2024 | Rana ........................ | G11C 7/06 |
| 2007/0081377 A1 | 4/2007 | Zheng et al. | |
| 2009/0161417 A1 | 6/2009 | Fackenthal et al. | |
| 2011/0261627 A1 | 10/2011 | Tanikawa | |

(Continued)

FOREIGN PATENT DOCUMENTS

KR 10-2012-0136662 A 12/2012

OTHER PUBLICATIONS

EESR dated Nov. 27, 2024 for corresponding EP Patent Application No. 24186193.9.

*Primary Examiner* — Xiaochun L Chen
(74) *Attorney, Agent, or Firm* — Muir Patent Law, PLLC

(57) ABSTRACT

A memory device may include a cell array including a first section and a second section that share a plurality of word lines comprising a first set of word lines and a second set of word lines, a first column decoder configured to select at least one bit line of a first set of bit lines connected to the first section, a second column decoder configured to select at least one bit line of a second set of bit lines connected to the second section, and a read circuit configured to output a data signal based on a comparison between an output of the first column decoder and an output of the second column decoder. The first section includes a plurality of first memory cells connected to at least one word line from the first set of word lines and configured to store bits of calibration data for calibrating the memory device, and the second section includes a plurality of second memory cells connected to the at least one word line and configured to store inverted bits of the calibration data.

16 Claims, 17 Drawing Sheets

(56)     References Cited

U.S. PATENT DOCUMENTS

| | | |
|---|---|---|
| 2016/0064092 A1 | 3/2016 | Roy et al. |
| 2016/0260897 A1 | 9/2016 | Redaelli et al. |
| 2019/0088328 A1 | 3/2019 | Antonyan |
| 2021/0264997 A1 | 8/2021 | Chu et al. |
| 2021/0383844 A1 | 12/2021 | Antonyan |
| 2022/0108995 A1 | 4/2022 | He et al. |
| 2023/0107851 A1 | 4/2023 | Rana et al. |
| 2023/0197122 A1 | 6/2023 | Shih et al. |

* cited by examiner

FIG. 7B

MEMORY DEVICE COMPRISING MEMORY CELLS STORING CALIBRATION DATA AND OPERATING METHOD THEREOF

CROSS-REFERENCE TO RELATED APPLICATIONS

This application is based on and claims priority under 35 U.S.C. § 119 to Korean Patent Application Nos. 10-2023-0088633, filed on Jul. 7, 2023, and 10-2023-0154567, filed on Nov. 9, 2023, in the Korean Intellectual Property Office, the disclosures of which are incorporated by reference herein in their entireties.

BACKGROUND

Aspects of the inventive concept relate to integrated circuits, and more particularly, to a memory device including memory cells storing calibration data, and an operating method thereof.

Memory devices manufactured through semiconductor processes may have variations due to various factors. For example, a reference used when reading data written into memory cells may vary due to factors such as process, voltage, temperature, and aging. A memory device may be calibrated to compensate for variations, and calibration data may be generated as a result of the calibration. The calibration data may be referenced before driving the memory device, and the memory device may be set based on the calibration data.

SUMMARY

Aspects of the inventive concept provide a memory device for efficiently providing calibration data, and an operating method thereof.

According to an aspect of the inventive concept, a memory device includes a cell array including a first section and a second section that share a plurality of word lines comprising a first set of word lines and a second set of word lines, a first column decoder configured to select at least one bit line of a first set of bit lines connected to the first section, a second column decoder configured to select at least one bit line of a second set of bit lines connected to the second section, and a read circuit configured to output a data signal based on a comparison between an output of the first column decoder and an output of the second column decoder. The first section includes a plurality of first memory cells connected to at least one word line from the first set of word lines and configured to store bits of calibration data for calibrating the memory device, and the second section includes a plurality of second memory cells connected to the at least one word line and configured to store inverted bits of the bits of calibration data.

According to an aspect of the inventive concept, a memory device includes a cell array including a first section and a second section that share a plurality of word lines, a first column decoder connected to the first section through a first set of bit lines of a plurality of bit lines, a second column decoder connected to the second section through a second set of bit lines of a plurality of bit lines, a read circuit configured to output a data signal based on a comparison between an output of the first column decoder and an output of the second column decoder, and an address decoder configured to provide, when a calibration data for calibrating the memory device is read, column addresses corresponding to each other to the first column decoder and the second column decoder, respectively.

According to an aspect of the inventive concept, a memory device includes a cell array including a first section and a second section that share a plurality of word lines. An operating method of the memory device includes writing, in response to at least one first write command, bits of calibration data for calibrating the memory device into a first region of the first section, and writing inverted bits of the bits of calibration data into a second region of the second section, and reading bits of the calibration data by simultaneously detecting, in response to a first read command, bits stored in the first region and inverted bits stored in the second region.

BRIEF DESCRIPTION OF THE DRAWINGS

Embodiments of the inventive concept will be more clearly understood from the following detailed description taken in conjunction with the accompanying drawings in which:

FIGS. 7A and 7B are block diagrams of examples of a memory device according to embodiments;

DETAILED DESCRIPTION OF THE EMBODIMENTS

Figure 1:
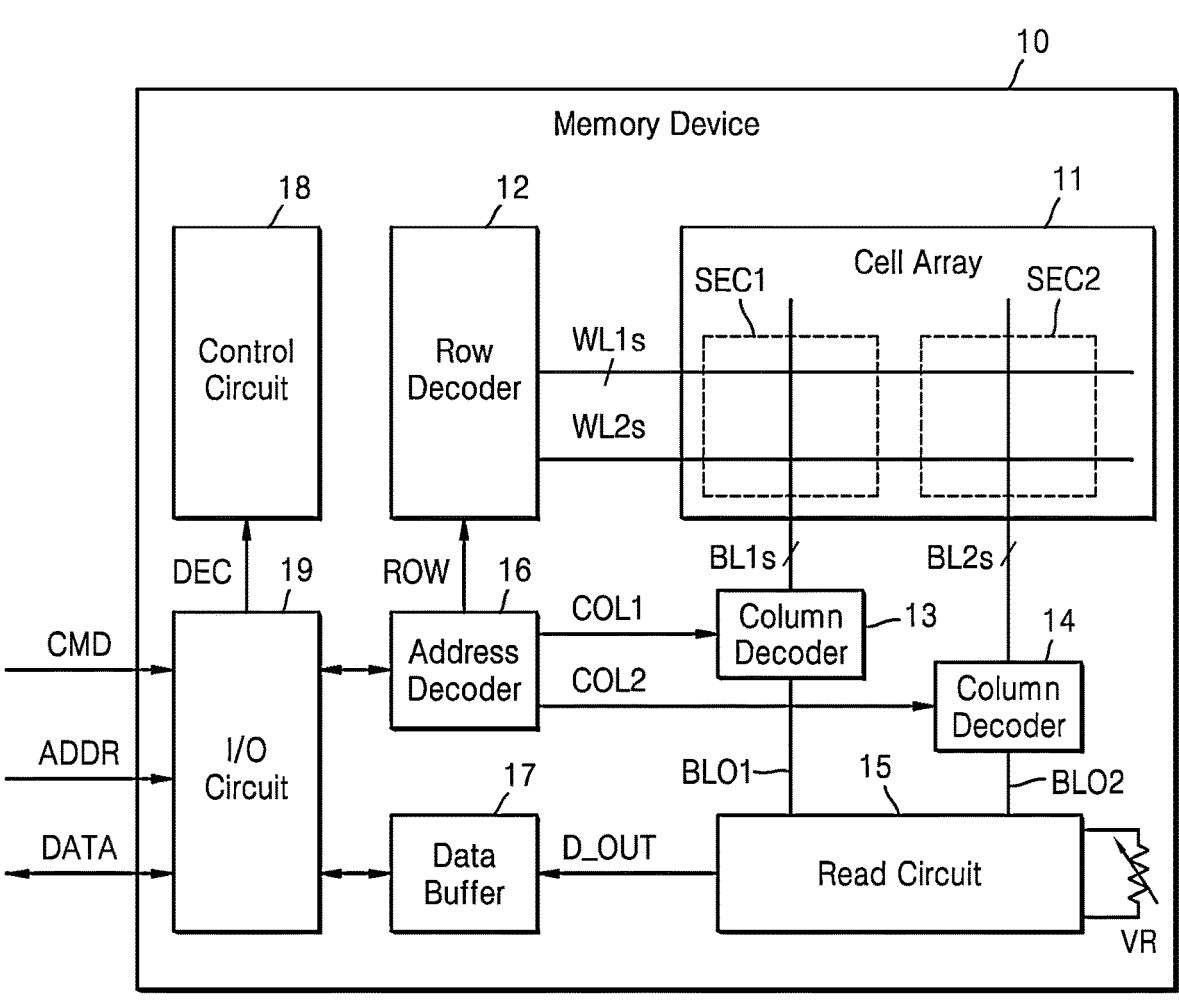
FIG. 1 is a block diagram of a memory device according to an embodiment.

FIG. 1 is a block diagram of a memory device 10 according to an embodiment. Referring to FIG. 1, the memory device 10 may receive a command CMD and an address ADDR and may receive or output data DATA. For example, the memory device 10 may receive, from a memory controller, a command CMD such as a write command or a read command, and an address ADDR corresponding to the command CMD. In addition, the memory device 10 may receive data DATA (i.e., write data) from the memory controller or provide data DATA (i.e., read data) to the memory controller. In some embodiments, at least two of the command CMD, the address ADDR, and the data DATA may be received or output through the same channel. As shown in FIG. 1, the memory device 10 may include a cell array 11, a row decoder 12, a first column decoder 13, a second column decoder 14, a read circuit 15, an address decoder 16, a data buffer 17, a control circuit 18, and an input/output (I/O) circuit 19.

The cell array 11 may include a first section SEC1 and a second section SEC2, and the first section SEC1 and the second section SEC2 may share a plurality of word lines with each other. For example, each of the first section SEC1 and the second section SEC2 may include a plurality of memory cells connected to a plurality of first word lines WL1s (e.g., a first set of word lines) and at least one second word line WL2s (e.g., a second set of word lines). Memory cells connected to one word line may be referred to as a page, and data may be read or written on a page basis. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The memory cells may be non-volatile memory cells and may not lose a stored value even when power supply to the memory device 10 is cut off. In some embodiments, the memory cells are a flash memory cells and may store a value according to a threshold voltage of a transistor. In some embodiments, each memory cell may include a variable resistance element (e.g., MTJ in FIG. 2A), and the variable resistance element may have a resistance corresponding to the value (or bit) stored in the memory cell. When the memory cell includes a variable resistance element, the memory device 10 may be referred to as a resistive memory device. For example, the memory device 10 may include, as non-limiting examples, a cell array 11 having a structure such as phase change random access memory (PRAM) and ferroelectric random access memory (FRAM), or a cell array 11 having a magnetic random access memory (MRAM) structure such as spin-transfer torque magnetic random access memory (STT-MRAM), spin torque transfer magnetization switching RAM (spin-RAM), and spin momentum transfer RAM (SMT-RAM). As described below with reference to FIG. 2A, embodiments are described primarily with reference to MRAM, but embodiments are not limited thereto.

Each of the first section SEC1 and the second section SEC2 may include a plurality of reference cells connected to the plurality of first word lines WL1s and the at least one second word line WL2s. Reference cells may be used to determine values stored in memory cells. For example, the first section SEC1 and the second section SEC2 may have the same or symmetrical structures. When one of the plurality of word lines is activated by the row decoder 12, not only a memory cell connected to the activated word line but also a reference cell connected to the activated word line may be selected. In order to compensate for an error due to a parasitic resistance of a wire, the reference cell of the second section SEC2 may be used when determining a value stored in the memory cell of the first section SEC1, and the reference cell of the first section SEC1 may be used when determining a value stored in the memory cell of the second section SEC2. Examples of operations of using a reference cell are described below with reference to FIGS. 4A and 4B.

The plurality of first word lines WL1s may be connected to a plurality of memory cells for storing user data, such as data written to and read from the memory device 10 by a host using the memory device 10. In addition, the at least one second word line WL2s may be connected to a plurality of memory cells for storing calibration data for calibrating the memory device 10. Memory devices manufactured through semiconductor processes may have variations due to various factors. For example, a variable resistance element included in a memory cell may have a resistance that varies due to factors such as process, voltage, temperature, and aging. The memory device 10 may be calibrated to compensate for variations, and calibration data may be generated as a result of the calibration. For example, the memory device 10 may be tested during a manufacturing stage, and calibration data may be generated based on the test result. The calibration data may be referenced before driving the memory device 10, and variations in the memory device 10 may be compensated for by setting the memory device 10 based on the calibration data. For example, calibration data may be used to adjust a voltage applied to memory cells during memory access operation. Accordingly, the calibration data may be stored in a non-volatile storage space so that the calibration data is not lost even when power supply to the memory device 10 is cut off.

The cell array 11 may include not only memory cells for storing user data, for example, memory cells connected to the plurality of first word lines WL1s, but also memory cells for storing calibration data, for example, memory cells connected to the at least one second word line WL2s. As described below with reference to the diagrams, the memory device 10 may store calibration data with high reliability, and thus, variations in the memory device 10 may be accurately and safely compensated for. In addition, because the cell array 11 and peripheral circuits for user data may be used as is for calibration data, the memory device 10 may have a simple structure and low cost. In addition, because a separate non-volatile storage device for storing calibration data may be omitted, a system including the memory device 10 may have a simple structure and low cost. In addition, because the calibration data stored in the cell array 11 may be updated, the memory device 10 may be useful to a user, and variations due to aging may be compensated for. In addition, because memory cells for storing calibration data may be easily added, calibrations for storing various variations may be possible.

The row decoder 12 may be connected to the first section SEC1 and the second section SEC2 through the plurality of first word lines WL1s and the at least one second word line WL2s. The row decoder 12 may activate at least one of the plurality of first word lines WL1s and the plurality of second word lines WL2s based on a row address ROW received from the address decoder 16, and memory cells and reference cells connected to the activated word line may be selected. For example, while the row decoder 12 activates, in response to the row address ROW, one of the plurality of first word lines WL1s to write or read user data, the row decoder 12 may activate at least one of the at least one second word line WL2s to write or read calibration data.

The first column decoder 13 may be connected to the first section SEC1 through a plurality of first bit lines BL1s (e.g., a first set of bit lines), and the second column decoder 14 may be connected to the second section SEC2 through a plurality of second bit lines BL2s (e.g., a second set of bit lines). The first column decoder 13 may select one of the plurality of first bit lines BL1s based on a first column address COL1 received from the address decoder 16 and may be connected to a first output bit line BLO1. In addition, the second column decoder 14 may select one of the plurality of second bit lines BL2s based on a second column address COL2 received from the address decoder 16 and may be connected to a second output bit line BLO2.

The read circuit 15 may be connected to the first column decoder 13 via the first output bit line BLO1 and may be connected to the second column decoder 14 via the second output bit line BLO2. The read circuit 15 may determine a value stored in a memory cell based on signals received via the first output bit line BLO1 and the second output bit line BLO2 and generate a data signal D_OUT including the determined value. In some embodiments, the read circuit 15 may provide a voltage of a predefined magnitude to each of the memory cell and the reference cell and determine a value stored in the memory cell by detecting currents passing through the memory cell and the reference cell (e.g., by comparing the currents or determining a difference between the currents). In some embodiments, the read circuit 15 may provide a current of a predefined magnitude to a memory cell and a reference cell and determine a value stored in the memory cell by detecting voltages applied to or output from the memory cell and the reference cell. Although it is assumed that the value stored in the memory cell is determined by detecting the current, embodiments are not limited thereto. Although not shown in FIG. 1, the memory device 10 may further include a write circuit for writing data to memory cells.

A variable resistor circuit VR may provide a variable resistance and may be connected to the read circuit 15. When memory cells storing user data, for example, memory cells connected to the plurality of first word lines WL1s, are read (e.g., during the user data being read from the memory cells), the read circuit 15 may electrically connect one of the first output bit line BLO1 and the second output bit line BLO2 to the variable resistor circuit VR and determine values stored in the memory cells. In addition, when memory cells storing calibration data, for example, memory cells connected to the at least one second word line WL2s, are read (e.g., during the calibration data being read from the memory cells), the read circuit 15 may electrically disconnect the variable resistor circuit VR from the first output bit line BLO1 and the second output bit line BLO2 and determine values stored in the memory cells. The variable resistor circuit VR may provide a resistance corresponding to a value included in the calibration data. For example, the control circuit 18 described below may identify a resistance based on calibration data read from the cell array 11 and provide a control signal to the variable resistor circuit VR to have the identified resistance. Therefore, the calibration data stored in cell array 11 and read from cell array 11 may be used to determine and control the resistance of a variable resistor circuit VR, which is used by the read circuit 15 to determine the value of user data stored in memory cells that store user data. The resistance may be controlled, in some embodiments to account for variations in process, voltage, and temperature, as well as device aging.

The address decoder 16 may generate the row address ROW, the first column address COL1, and the second column address COL2 based on an address received via the I/O circuit 19. The data buffer 17 may receive the data signal D_OUT from the read circuit 15 and store data corresponding to the data signal D_OUT. The data buffer 17 may provide the stored data to the I/O circuit 19.

The I/O circuit 19 may provide a memory interface. For example, the I/O circuit 19 may receive the command CMD and the address ADDR from the outside and receive or output the data DATA from or to the outside. The I/O circuit 19 may generate a decoded signal DEC by decoding the command CMD and provide the address ADDR to the address decoder 16. The I/O circuit 19 may provide the received data DATA to the data buffer 17 and output the data DATA received from the data buffer 17 to the outside.

The control circuit 18 may receive the decoded signal DEC from the I/O circuit 19 and control elements of the memory device 10 based on the decoded signal DEC. For example, the control circuit 18 may identify an indication of a write operation or a read operation based on the decoded signal DEC and control the elements to perform the write operation or the read operation.

In some embodiments, the memory device 10 may be set to a calibration mode for writing or reading calibration data or a normal mode for writing or reading user data. In some embodiments, the command CMD for indicating a calibration mode or a normal mode may be received, and the command CMD may set the memory device 10 to the calibration mode or the normal mode based on the decoded signal DEC. In some embodiments, when access to memory cells connected to the plurality of first word lines WL1s is identified, the address decoder 16 may set the memory device 10 to the normal mode based on an address, and when access to memory cells connected to the at least one second word line WL2s is identified, the address decoder 16 may set the memory device 10 to the calibration mode.

Figure 2A:
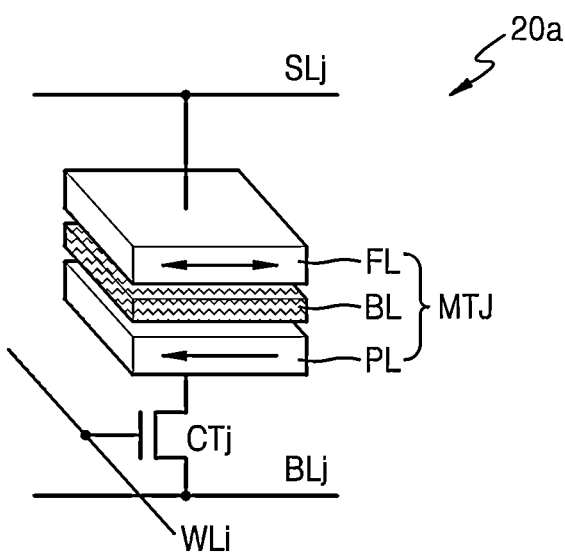
FIGS. 2A and 2B are diagrams respectively illustrating a memory cell and a reference cell according to embodiments.
Figure 2B:
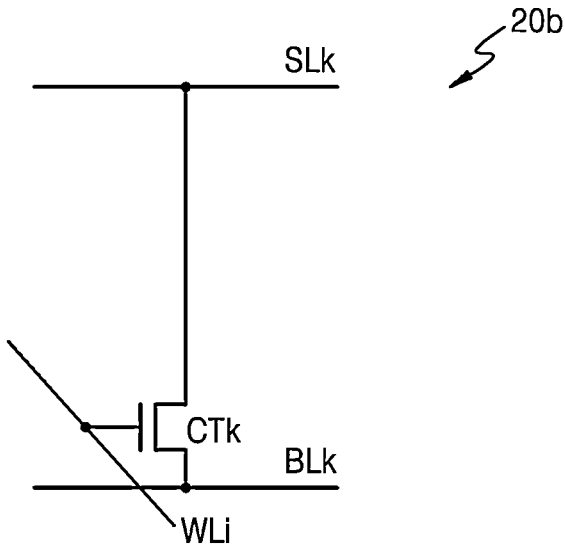

FIGS. 2A and 2B are diagrams respectively illustrating a memory cell 20a and a reference cell 20b according to embodiments. For example, the cell array 11 in FIG. 1 may include the memory cell 20a in FIG. 2A and the reference cell 20b in FIG. 2B. Hereinafter, descriptions that are the same as those of FIGS. 2A and 2B are omitted.

Referring to FIG. 2A, the memory cell 20a may include a variable resistance element MTJ and a cell transistor CTj connected in series with each other between a source line SLj and a bit line BLj. In some embodiments, unlike shown in FIG. 2A, the cell transistor CTj may be connected to the source line SLj and the variable resistance element MTJ may be connected to the bit line BLj. The variable resistance element MTJ may include a free layer FL and a pinned layer PL, and may include a barrier layer BL between the free layer FL and the pinned layer PL. As indicated by arrows in FIG. 2A, while a magnetization direction of the pinned layer PL may be fixed, the free layer FL may have a magnetization direction that is the same as or opposite to the magnetization direction of the pinned layer PL. When the pinned layer PL and the free layer FL have the same magnetization directions, the variable resistance element MTJ may be referred to as being in a parallel state P, and when the pinned layer PL and the free layer FL have mutually opposite magnetization directions, the variable resistance element MTJ may be referred to as being in an anti-parallel state AP. In some embodiments, the variable resistance element MTJ may further include an anti-ferromagnetic layer so that the pinned layer PL has a fixed magnetization direction.

The variable resistance element MTJ may have a relatively low resistance $R_P$ in the parallel state P but may have a relatively high resistance RAP in the anti-parallel state AP. Herein, when the variable resistance element MTJ in the parallel state P has a low resistance $R_P$, the memory cell 20a is assumed to store "0", and when the variable resistance element MTJ in the anti-parallel state AP has a high resistance RAP, the memory cell 20a is assumed to store "1". In addition, herein, the resistance $R_P$ corresponding to "0" may be referred to as a parallel resistance, and the resistance RAP corresponding to "1" may be referred to as an anti-parallel resistance. However, this embodiment is merely an example, and the parallel state P having a relatively low resistance $R_P$, in other embodiments, could be set to store "1", and the anti-parallel state AP having a relatively high resistance RAP, could be set to store "0."

The cell transistor CTj may have a gate connected to a word line WLi, and a source and a drain connected to the bit line BLj and the variable resistance element MTJ. The cell transistor CTj may electrically connect or block the variable resistance element MTJ and the bit line BLj according to a signal applied to the word line WLi. For example, in a write operation, in order to write "0" to the memory cell 20a, the cell transistor CTj may be turned on, and a current from the source line SLj to the bit line BLj may pass through the variable resistance element MTJ and the cell transistor CTj. In addition, in order to write "1" to the memory cell 20a, the cell transistor CTj may be turned on, and a current from the bit line BLj to the source line SLj may pass through the cell transistor CTj and the variable resistance element MTJ. In a read operation, the cell transistor CTj may be turned on, and a current from the source line SLj to the bit line BLj or a current from the bit line BLj to the source line SLj, for example, a read current, may pass through the cell transistor CTj and the variable resistance element MTJ. Herein, the read current is assumed to flow from the source line SLj to the bit line BLj.

Referring to FIG. 2B, the reference cell 20b may include a cell transistor CTk connected between a source line SLk and a bit line BLk. Compared to the memory cell 20a in FIG. 2A, the variable resistance element MTJ may be omitted in the reference cell 20b, and the reference cell 20b may be referred to as a shorted cell. As described above with reference to FIG. 1, the memory device 10 may include the variable resistor circuit VR outside the cell array 11, and in order to determine a value stored in the memory cell 20a, a resistance of the variable resistance element MTJ may be compared to a resistance of the variable resistor circuit VR due to the reference cell 20b, which is a shorted cell. For example, if the resistance of the variable resistance element MTJ is greater than the resistance of the variable resistor circuit VR, the value stored in the memory cell 20a may be a first value (e.g., a "1" bit), and if the resistance of the variable resistance element MTJ is less than the resistance of the variable resistor circuit VR, the value stored in the memory cell 20a may be a second value (e.g., a "0" bit). The variable resistor circuit VR may facilitate adjustment of a resistance and provide more advantageous characteristics than the variable resistance element MTJ. Hereinafter, it is assumed that a reference cell is a shorted cell, similar to the reference cell 20b in FIG. 2B. However, the reference cell may be a reference cell including the variable resistance element MTJ. Herein, the reference cell and the variable resistor circuit VR may be collectively referred to as a reference circuit.

Figure 3:
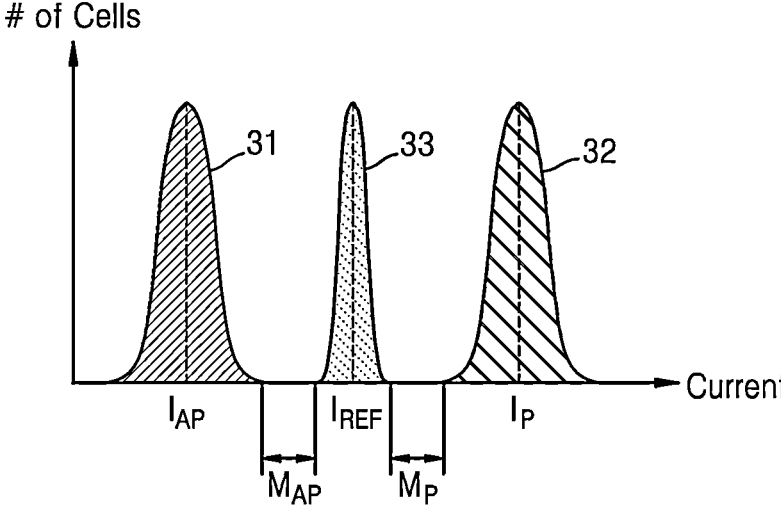
FIG. 3 is a graph showing a distribution of a memory cell and a reference according to an embodiment.

FIG. 3 is a graph showing a distribution of memory cell and reference circuits according to an embodiment. For example, the graph in FIG. 3 shows memory cells in the parallel state P and in the anti-parallel state AP, and shows a state of reference cells. Distributions 31, 32, and 33 represent currents passing through the memory cells in the anti-parallel state AP, currents passing through the reference cells, and currents passing through the memory cells in the parallel state P. In the graph in FIG. 3, the current passing through a reference cell may correspond to a current passing through a shorted cell and a variable resistor circuit VR.

A resistance of the variable resistance element MTJ for a set of memory cells may have a distribution, and accordingly, when a constant voltage is applied to the variable resistance element MTJ for the set of memory cells, a current distribution may occur. For example, as shown in FIG. 3, the distribution 31 having an average current $I_{AP}$ in memory cells storing "1" may be present, along with the distribution 32 having an average current $I_P$ in memory cells storing "0". In addition, the distribution 33 having an average current $I_{REF}$ may be present in the reference circuit. Accordingly, when a value stored in a memory cell is determined based on the current, a memory cell in the anti-parallel state AP may have a read margin $M_{AP}$ and a memory cell in the parallel state P may have a read margin $M_P$. As the read margins $M_{AP}$ and $M_P$ increase, the reliability of the memory device may be improved. The reference current may be defined by calibration data. For example, as described above with reference to FIG. 1, the resistance of the variable resistor circuit VR may be adjusted by the calibration data, and the calibration data may be generated by testing the memory device 10 so that large read margins $M_{AP}$ and $M_P$ occur in the memory device 10.

Figure 4A:
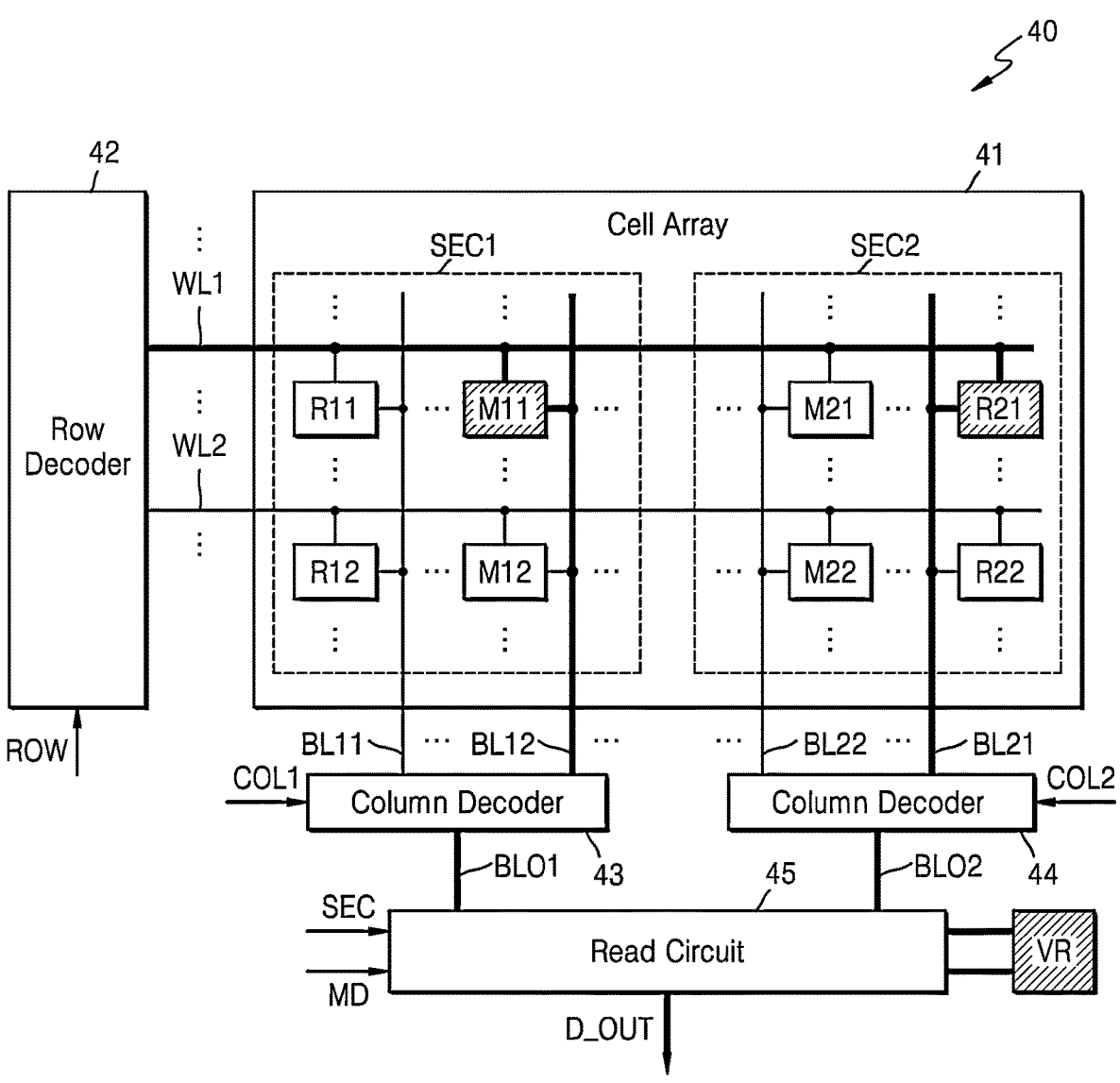
FIGS. 4A and 4B are block diagrams of a memory device which reads user data, according to embodiments.
Figure 4B:
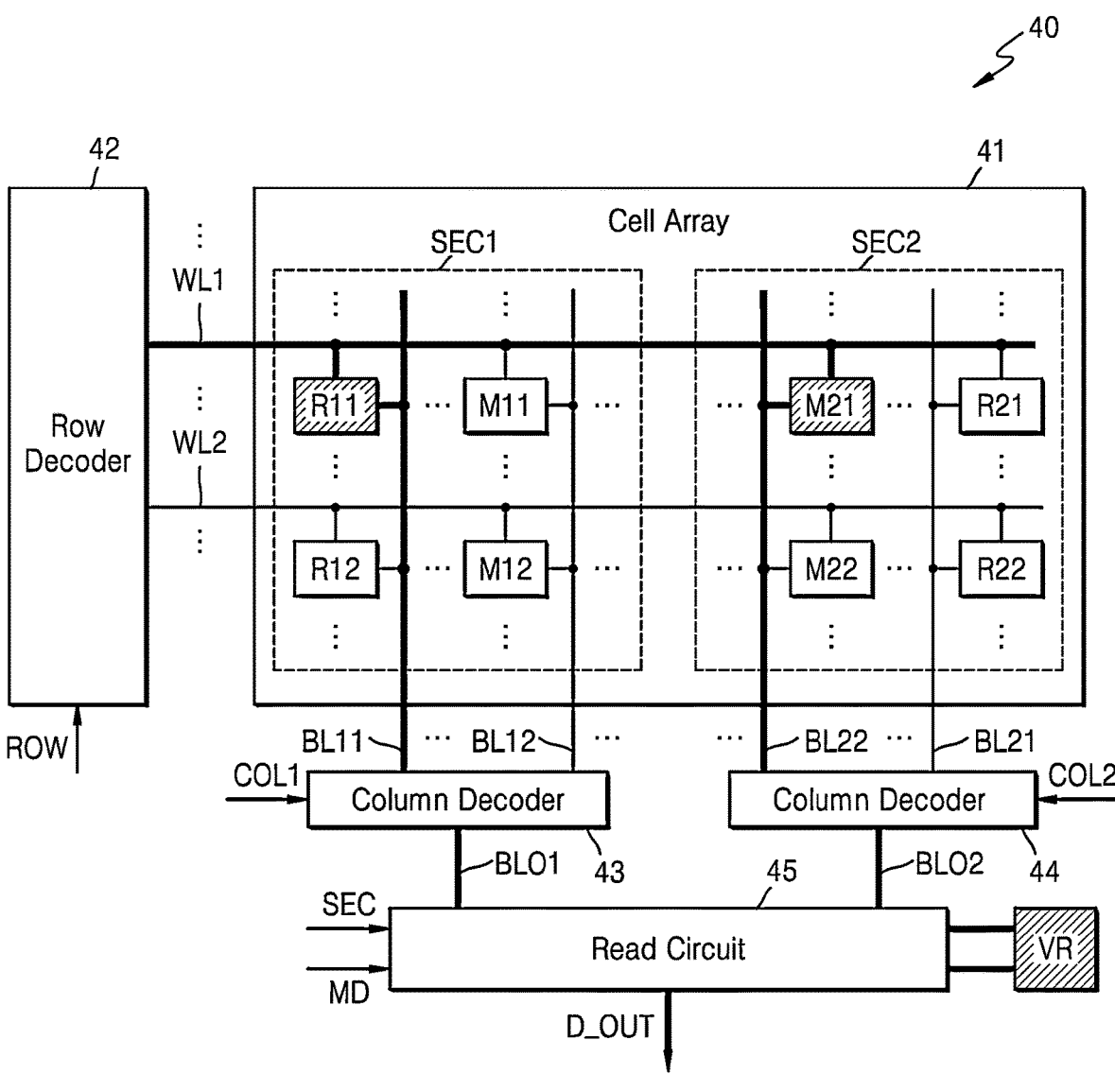

FIGS. 4A and 4B are block diagrams of a memory device 40 which reads user data, according to embodiments. For example, the block diagram in FIG. 4A shows the memory device 40 in a situation in which it reads user data stored in the first section SEC1, and the block diagram in FIG. 4B shows the memory device 40 in a situation in which it reads user data stored in the second section SEC2. In FIGS. 4A and 4B, lines and blocks that are activated or used in a read operation are displayed in bold or hatched. In FIGS. 4A and 4B, descriptions that are the same as those given above with reference to the drawings are omitted.

As shown in FIGS. 4A and 4B, the memory device 40 may include a cell array 41, a row decoder 42, a first column decoder 43, a second column decoder 44, a read circuit 45, and a variable resistor circuit VR. The cell array 41 may include a first section SEC1 and a second section SEC2. The first section SEC1 may include memory cells M11 and M12 and reference cells R11 and R12, and the second section SEC2 may include memory cells M21 and M22 and reference cells R21 and R22. The memory cell M11 and the reference cell R11 of the first section SEC1 and the memory cell M21 and the reference cell R21 of the second section SEC2 may be connected to a first word line WL1, and the memory cell M12 and the reference cell R12 of the first section SEC1 and the memory cell M22 and the reference cell R22 of the second section SEC2 may be connected to a second word line WL2. The reference cells R11 and R12 of the first section SEC1 may be connected to a first bit line BL11 of a first set of bit lines, and the memory cells M11 and M12 of the first section SEC1 may be connected to a second bit line BL12 of the first set of bit lines. The reference cells R21 and R22 of the second section SEC2 may be connected to a first bit line BL21 of a second set of bit lines, and the memory cells M21 and M22 of the second section SEC2 may be connected to a second bit line BL22 of the second set of bit lines.

Referring to FIG. 4A, in order to read a value stored in the memory cell M11 of the first section SEC1, the row decoder 42 may activate the first word line WL1 in response to the row address ROW. While the first column decoder 43 may select the second bit line BL12 connected to the memory cell M11 in response to the first column address COL1, the second column decoder 44 may select the first bit line BL21 connected to the reference cell R21 in response to the second column address COL2. Accordingly, the first output bit line BLO1 may be electrically connected to the second bit line BL12 of the first set of bit lines, and the second output bit line BLO2 may be electrically connected to the first bit line BL21 of the second set of bit lines.

The read circuit 45 may receive a section signal SEC from the address decoder 16 in FIG. 1 and may receive a mode signal MD from the control circuit 18 in FIG. 1. In some embodiments, the address decoder 16 in FIG. 1 may identify, based on an address received from the I/O circuit 19, access to memory cells storing user data or memory cells storing calibration data, and accordingly, the mode signal MD may be generated by the address decoder 16. The section signal SEC may represent a section including a memory cell to be read, that is, the first section SEC1, and the mode signal MD may represent a mode in which an operation of reading user data is performed, that is, the normal mode. The read circuit 45 may electrically connect the second output bit line BLO2 to the variable resistor circuit VR in response to the section signal SEC. Accordingly, the read circuit 45 may determine a value stored in the memory cell M11 by comparing a current passing through the memory cell M11 and a current passing through the variable resistor circuit VR to each other and generate a data signal D_OUT including the determined value (e.g., if the current passing through the memory cell M11 is greater than a current passing through the variable resistor circuit VR, the data signal D_OUT will have a first value, and if the current passing through the memory cell M11 is less than a current passing through the variable resistor circuit VR, the data signal D_OUT will have a second value). For example in some embodiments, a comparison between outputs may be used to determine a difference between the outputs (e.g., difference between currents), and based on the difference, a particular value will be output by the data signal D_OUT.

Referring to FIG. 4B, in order to read a value stored in the memory cell M21 of the second section SEC2, the row decoder 42 may activate the first word line WL1 in response to the row address ROW. While the first column decoder 43 may select the first bit line BL11 connected to the reference cell R11 in response to the first column address COL1, the second column decoder 44 may select the second bit line BL22 connected to the memory cell M21 in response to the second column address COL2. Accordingly, the first output bit line BLO1 may be electrically connected to the first bit line BL11, and the second output bit line BLO2 may be electrically connected to the second bit line BL22.

The read circuit 45 may electrically connect the first output bit line BLO1 to the variable resistor circuit VR in response to the section signal SEC representing the second section SEC2. Accordingly, the read circuit 45 may determine a value stored in the memory cell M21 by comparing a current passing through the memory cell M21 and a current passing through the variable resistor circuit VR to each other and generate a data signal D_OUT including the determined value.

Figure 5:
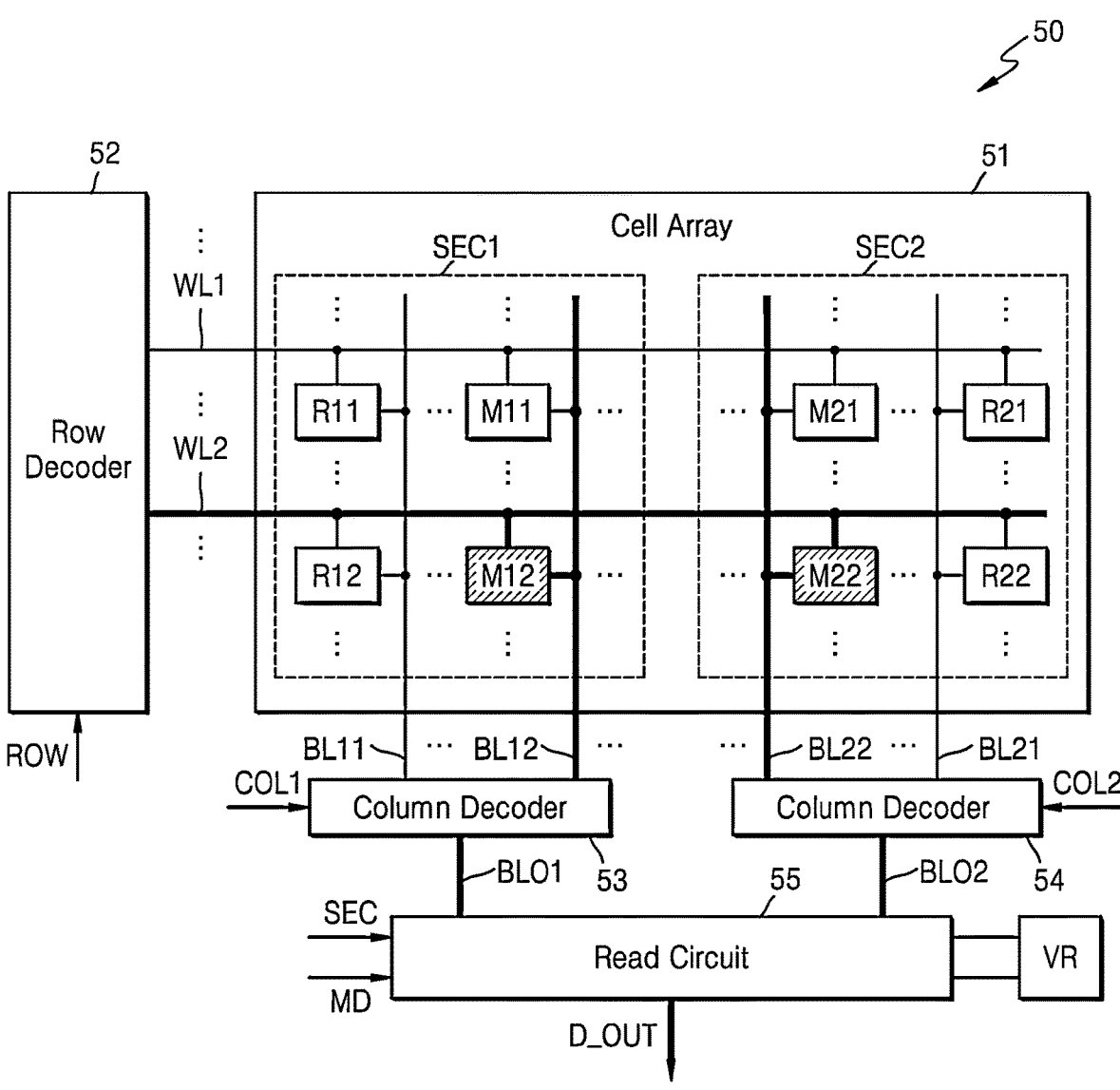
FIG. 5 is a block diagram of a memory device which reads calibration data, according to an embodiment.

FIG. 5 is a block diagram of a memory device 50 which reads calibration data, according to an embodiment. In FIG. 5, lines and blocks that are activated or used in a read operation may be displayed in bold or hatched. The memory device 50 in FIG. 5 may have the same structure as the memory device 40 in FIGS. 4A and 4B. In FIG. 5, descriptions that are the same as those given above with reference to the drawings are omitted.

As shown in FIG. 5, the memory device 50 may include a cell array 51, a row decoder 52, a first column decoder 53, a second column decoder 54, a read circuit 55, and a variable resistor circuit VR. The cell array 51 may include a first section SEC1 and a second section SEC2. The first section SEC1 may include memory cells M11 and M12 and reference cells R11 and R12, and the second section SEC2 may include memory cells M21 and M22 and reference cells R21 and R22. The memory cell M11 and the reference cell R11 of the first section SEC1 and the memory cell M21 and the reference cell R21 of the second section SEC2 may be connected to the first word line WL1, and the memory cell M12 and the reference cell R12 of the first section SEC1 and the memory cell M22 and the reference cell R22 of the second section SEC2 may be connected to the second word line WL2. The reference cells R11 and R12 of the first section SEC1 may be connected to the first bit line BL11 of a first set of bit lines, and the memory cells M11 and M12 of the first section SEC1 may be connected to the second bit line BL12 of the first set of bit lines. The reference cells R21 and R22 of the second section SEC2 may be connected to the first bit line BL21 of a second set of bit lines, and the memory cells M21 and M22 of the second section SEC2 may be connected to the second bit line BL22 of the second set of bit lines.

While memory cells included in the first section SEC1 may store bits of calibration data, memory cells included in the second section SEC2 may store inverted bits of the bits of calibration data. For example, while the memory cell M12 of the first section SEC1 connected to the second word line WL2 may store a first bit of calibration data, the memory cell M22 of the second section SEC2 connected to the second word line WL2 may store an inverted first bit (e.g., wherein the first bit is a "1" and the inverted first bit is a "0," or vice versa). Herein, the inverted first bit may be an inverted version of the first bit and may be referred to as a first inverted bit. To this end, in a process of testing the memory device 50, bits of calibration data may be written in the first section SEC1 and inverted bits of calibration data may be written in the second section SEC2.

In order to read calibration data, the row decoder 52 may activate the second word line WL2 in response to the row address ROW. While the first column decoder 53 may select the second bit line BL12 connected to the memory cell M12 in response to the first column address COL1, the second column decoder 54 may select the second bit line BL22 connected to the memory cell M22 in response to the second column address COL2. Accordingly, the first output bit line BLO1 may be electrically connected to the second bit line BL12, and the second output bit line BLO2 may be electrically connected to the second bit line BL22.

In some embodiments, the address decoder 16 in FIG. 1 may receive the mode signal MD from the control circuit 18. When the mode signal MD represents a normal mode, as described above with reference to FIGS. 4A and 4B, the address decoder 16 may generate the first column address COL1 and the second column address COL2 so that one of the first output bit line BLO1 and the second output bit line BLO2 is electrically connected to a reference cell. In addition, when the mode signal MD represents a calibration mode, as shown in FIG. 5, the address decoder 16 may generate the first column address COL1 and the second column address COL2 so that both the first output bit line BLO1 and the second output bit line BLO2 are electrically connected to memory cells, respectively. The address decoder 16 may generate, from one address, the first column address COL1 and the second column address COL2 included in a column address pair in the calibration mode to access the memory cell M12 and the memory cell M22 respectively storing a first bit and an inverted first bit of the calibration data. For example, the memory cell M12 and the memory cell M22 may correspond to the same column address, and accordingly, the first column address COL1 and the second column address COL2 may be identical to each other. Herein, the first column address COL1 and the second column address COL2 included in the column address pair may be referred to as corresponding to each other.

The read circuit 55 may electrically disconnect the first output bit line BLO1 and the second output bit line BLO2 from the variable resistor circuit VR in response to the mode signal MD representing the calibration mode. Accordingly, the read circuit 55 may determine a bit of the calibration data by comparing a current passing through the memory cell M12 to a current passing through the memory cell M22, and generate a data signal D_OUT including the determined bit. As described above, the memory cell M12 and the memory cell M22 may respectively store mutually inverted bits, and accordingly, as described below with reference to FIG. 6, the read circuit 55 may determine a bit of the calibration data with a high read margin.

Figure 6:
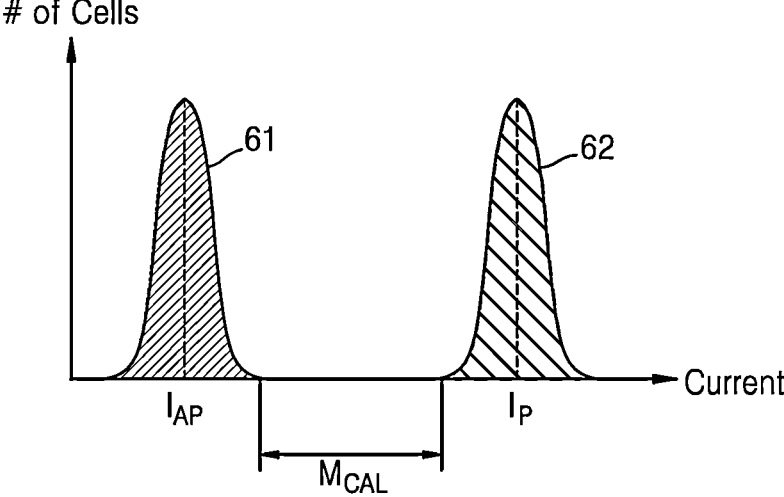
FIG. 6 is a graph showing a distribution of a memory cell according to an embodiment.

FIG. 6 is a graph showing a distribution of a memory cell according to an embodiment. For example, the graph in FIG. 6 shows distributions 61 and 62 of currents passing through memory cells in the parallel state P and memory cells in the anti-parallel state AP to store calibration data.

A memory cell storing calibration data may have the same structure as other memory cells, for example, a memory cell storing user data, and the distributions 61 and 62 in FIG. 6 may be respectively identical to the distributions 31 and 32 in FIG. 3. As described above with reference to FIG. 3, a read operation on a memory cell storing user data may have read margins $M_{AP}$ and $M_P$ based on a reference circuit. However, a read operation on a memory cell storing calibration data may have a larger read margin $M_{CAL}$ as shown in FIG. 6, due to memory cells respectively storing mutually inverted bits. Accordingly, the operation of reading calibration data may be performed without a reference circuit, and the calibration data defining the reference circuit set before the operation of reading user data is performed may be safely stored and read with high reliability.

Figure 7A:
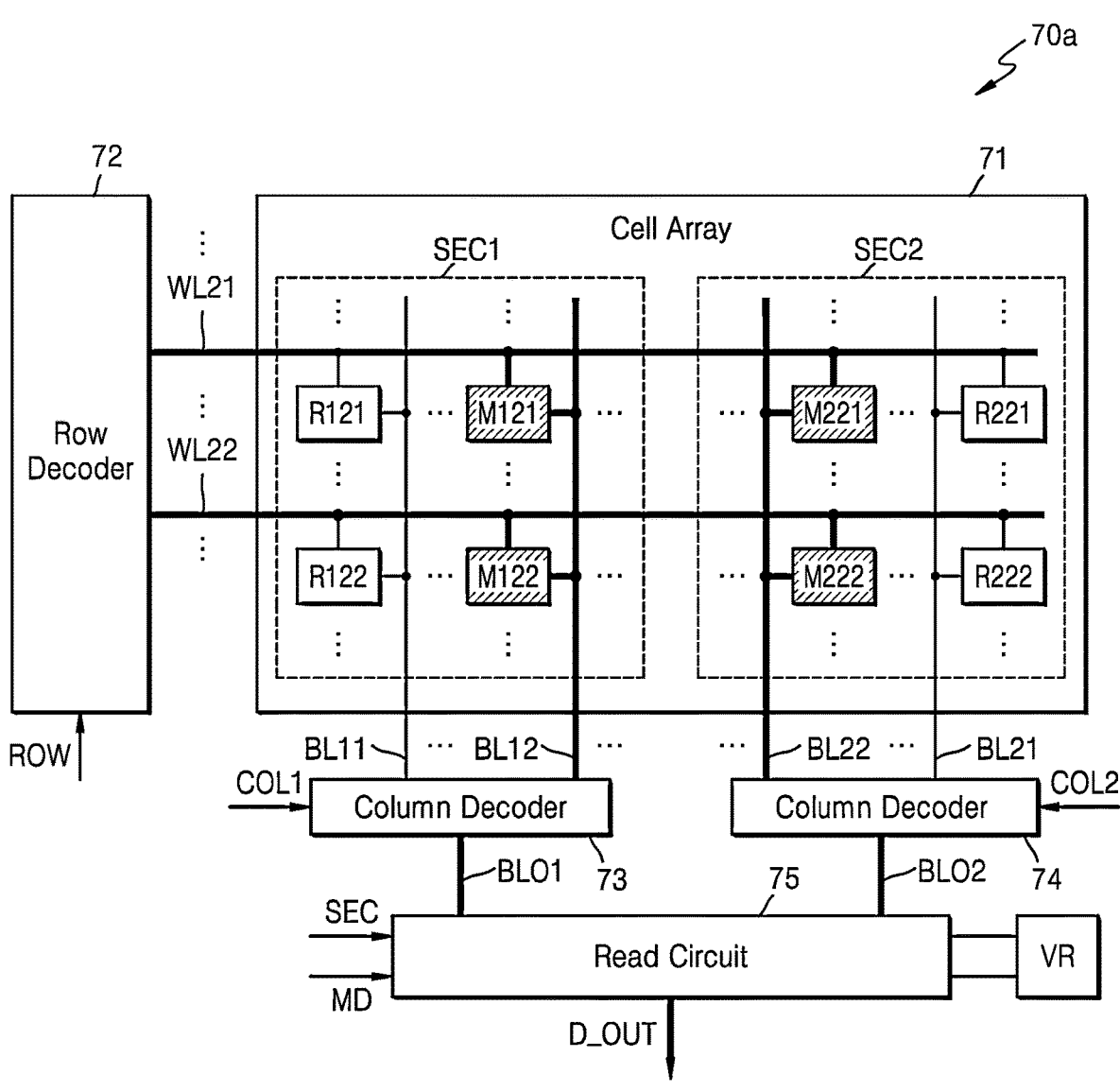
Figure 7B:
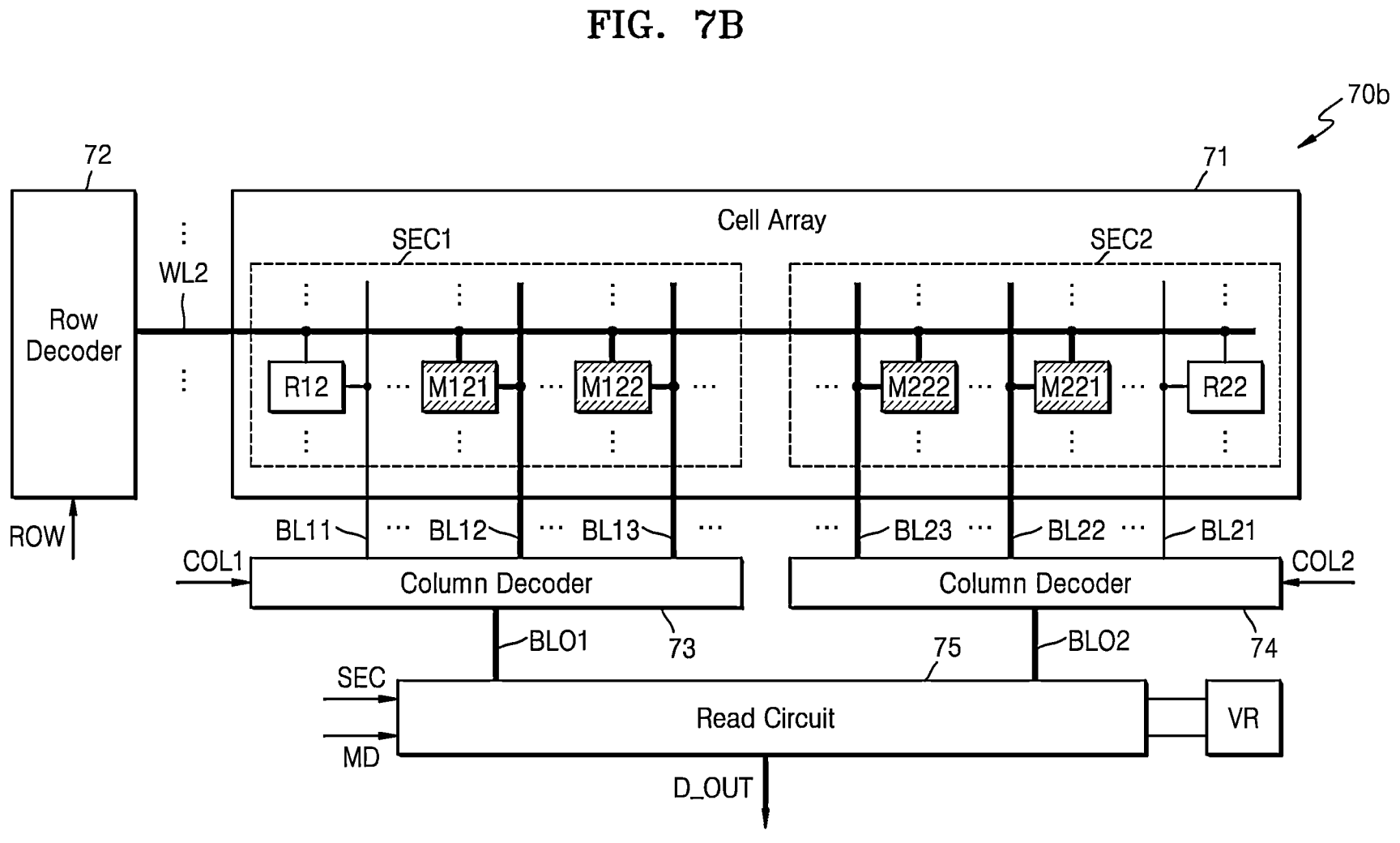

FIGS. 7A and 7B are block diagrams of examples of a memory device according to embodiments. For example, the block diagrams in FIGS. 7A and 7B respectively show memory devices 70a and 70b that perform an operation of reading calibration data. As described below, the memory devices 70a and 70b may store bits of calibration data redundantly for a larger read margin. In FIGS. 7A and 7B, bits of calibration data are redundantly stored in two memory cells. However, it will be understood that bits of calibration data may be redundantly stored in three or more memory cells. In FIGS. 7A and 7B, lines and blocks that are activated or used in a read operation may be displayed in bold or hatched. In FIGS. 7A and 7B, descriptions that are the same as those given above with reference to the drawings are omitted.

Referring to FIG. 7A, the memory device 70a may include a cell array 71, a row decoder 72, a first column decoder 73, a second column decoder 74, a read circuit 75, and a variable resistor circuit VR. The cell array 71 may include a first section SEC1 and a second section SEC2. The first section SEC1 may include memory cells M121 and M122 and reference cells R121 and R122, and the second section SEC2 may include memory cells M221 and M222 and reference cells R221 and R222. The memory cell M121 and the reference cell R121 of the first section SEC1 and the memory cell M221 and the reference cell R221 of the second section SEC2 may be connected to a first word line WL21 of a second set of word lines, and the memory cell M122 and the reference cell R122 of the first section SEC1 and the memory cell M222 and the reference cell R222 of the second section SEC2 may be connected to a second word line WL22 of the second set of word lines. The reference cells R121 and R122 of the first section SEC1 may be connected to a first bit line BL11 of a first set of bit lines, and the memory cells M121 and M122 of the first section SEC1 may be connected to a second bit line BL12 of the first set of bit lines. The reference cells R221 and R222 of the second section SEC2 may be connected to a first bit line BL21 of a second set of bit lines, and the memory cells M221 and M222 of the second section SEC2 may be connected to a second bit line BL22 of the second set of bit lines. Unlike shown in FIG. 7A, in some embodiments, the word lines WL21 and WL22 may not be adjacent to each other, and an additional word line may be arranged between the word lines WL21 and WL22.

As described above with reference to FIG. 5, memory cells included in the first section SEC1 may store bits of calibration data, and memory cells included in the second section SEC2 may store inverted bits of calibration data. For example, while the memory cell M121 of the first section SEC1 connected to the word line WL21 may store a first bit of calibration data, the memory cell M221 of the second section SEC2 connected to the word line WL21 may store an inverted first bit. In addition, memory cells may redundantly store bits of calibration data. For example, the memory cell M122 of the first section SEC1 connected to the word line WL22 may store a first bit stored in the memory cell M121 commonly connected to the bit line BL12, and the memory cell M222 of the second section SEC2 connected to the word line WL22 may store a first inverted bit stored in the memory cell M221 commonly connected to the bit line BL22.

The row decoder 72 may activate two or more word lines so that memory cells redundantly storing bits are simultaneously selected. For example, as shown in FIG. 7A, the row decoder 72 may simultaneously activate the word line WL21 and the word line WL22 in response to the row address ROW, and the memory cells M121 and M122 of the first section SEC1 and the memory cells M221 and M222 of the second section SEC2 may be simultaneously selected. Accordingly, the memory cells M121 and M122 may be electrically connected to each other in parallel, and the memory cells M221 and M222 may be electrically connected to each other in parallel. While the first column decoder 73 may select the bit line BL12 connected to the memory cells M121 and M122 in response to the first column address COL1, the second column decoder 74 may select the bit line BL22 connected to the memory cells M221 and M222 in response to the second column address COL2. Accordingly, the first output bit line BLO1 may be electrically connected to the bit line BL12, and the second output bit line BLO2 may be electrically connected to the bit line BL22.

The read circuit 75 may determine bits of calibration data by comparing the sum of currents passing through the memory cells M121 and M122 of the first section SEC1 to the sum of currents passing through the memory cells M221 and M222 of the second section SEC2 and generate a data signal D_OUT including the determined bit. A current passing through two memory cells connected to each other in parallel may have a larger magnitude than a current passing through one memory cell, and accordingly, a large read margin may be possible, as described below with reference to FIG. 8.

Referring to FIG. 7B, the memory device 70b may include a cell array 71, a row decoder 72, a first column decoder 73, a second column decoder 74, a read circuit 75, and a variable resistor circuit VR. The cell array 71 may include a first section SEC1 and a second section SEC2. The first section SEC1 may include memory cells M121 and M122 and a reference cell R12, and the second section SEC2 may include memory cells M222 and M221 and a reference cell R22. The memory cells M121 and M122 and the reference cell R12 of the first section SEC1 and the memory cells M221 and M222 and the reference cell R22 of the second section SEC2 may be connected to the second word line WL2. The reference cell R12 of the first section SEC1 and the memory cells M121 and M122 may be respectively connected to the bit lines BL11, BL12, and BL13 of a first set of bit lines, and the reference cell R22 of the second section SEC2 and the memory cells M221 and M222 may be respectively connected to the bit lines BL21, BL22, and BL23 of a second set of bit lines.

As described above with reference to FIG. 5, memory cells included in the first section SEC1 may store bits of calibration data, and memory cells included in the second section SEC2 may store inverted bits of calibration data. For example, while the memory cell M121 of the first section SEC1 connected to the second word line WL2 may store a first bit of calibration data, the memory cell M221 of the second section SEC2 connected to the second word line WL2 may store a first inverted bit. In addition, memory cells may redundantly store bits of calibration data. For example, the memory cell M122 of the first section SEC1 connected to the bit line BL13 may store a first bit stored in the memory cell M121 commonly connected to the second word line WL2, and the memory cell M222 of the second section SEC2 connected to the bit line BL23 may store a first inverted bit stored in the memory cell M221 commonly connected to the second word line WL2.

The row decoder 72 may activate the second word line WL2 in response to the row address ROW. Each of the first column decoder 73 and the second column decoder 74 may select two or more bit lines so that memory cells redundantly storing bits are simultaneously selected. For example, as shown in FIG. 7B, the first column decoder 73 may select two bit lines BL12 and BL13 in response to the first column address COL1, and the memory cells M121 and M122 of the first section SEC1 may be simultaneously selected. In addition, the second column decoder 74 may select two bit lines BL22 and BL23 in response to the second column address COL2, and the memory cells M221 and M222 of the second section SEC2 may be simultaneously selected. Accordingly, the memory cells M121 and M122 may be electrically connected to each other in parallel, and the memory cells M221 and M222 may be electrically connected to each other in parallel. In addition, the first output bit line BLO1 may be electrically connected to the two bit lines BL12 and BL13, and the second output bit line BLO2 may be electrically connected to the two bit lines BL22 and BL23.

The read circuit 75 may determine bits of calibration data by comparing the sum of currents passing through the memory cells M121 and M122 of the first section SEC1 to the sum of currents passing through the memory cells M221 and M222 of the second section SEC2 and generate a data signal D_OUT including the determined bit. A current passing through two memory cells connected to each other in parallel may have a larger magnitude than a current passing through one memory cell, and accordingly, a large read margin may be possible, as described below with reference to FIG. 8.

Figure 8:
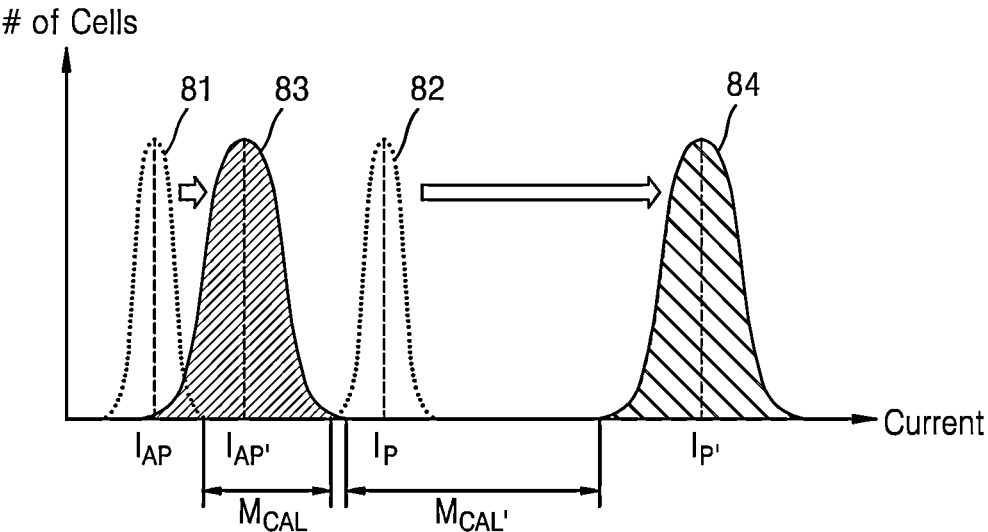
FIG. 8 is a graph showing a distribution of a memory cell according to an embodiment.

FIG. 8 is a graph showing a distribution of memory cells according to an embodiment. For example, the graph in FIG. 8 shows distributions 81, 82, 83, and 84 of currents passing through memory cells in the parallel state P and memory cells in the anti-parallel state AP to store calibration data.

As described above with reference to FIG. 6, an operation of reading calibration data from memory cells respectively storing mutually inverted bits may have a read margin $M_{CAL}$ defined by the distributions 81 and 82. As described above with reference to FIGS. 7A and 7B, when two memory cells redundantly store bits of calibration data, a current passing through the two memory cells may increase approximately by two times. Accordingly, the distribution 83 having an average current $I_{AP}'$ may be present in two memory cells in the anti-parallel state AP ($I_{AP}'=2I_{AP}$), and the distribution 84 having an average current $I_P'$ may be present in two memory cells in the parallel state P ($I_P'=2I_P$). Due to the distributions 83 and 84, a read margin $M_{CAL}'$ that is larger than the read margin $M_{CAL}$ may occur. Accordingly, calibration data may be safely stored and read with higher reliability.

Figure 9:
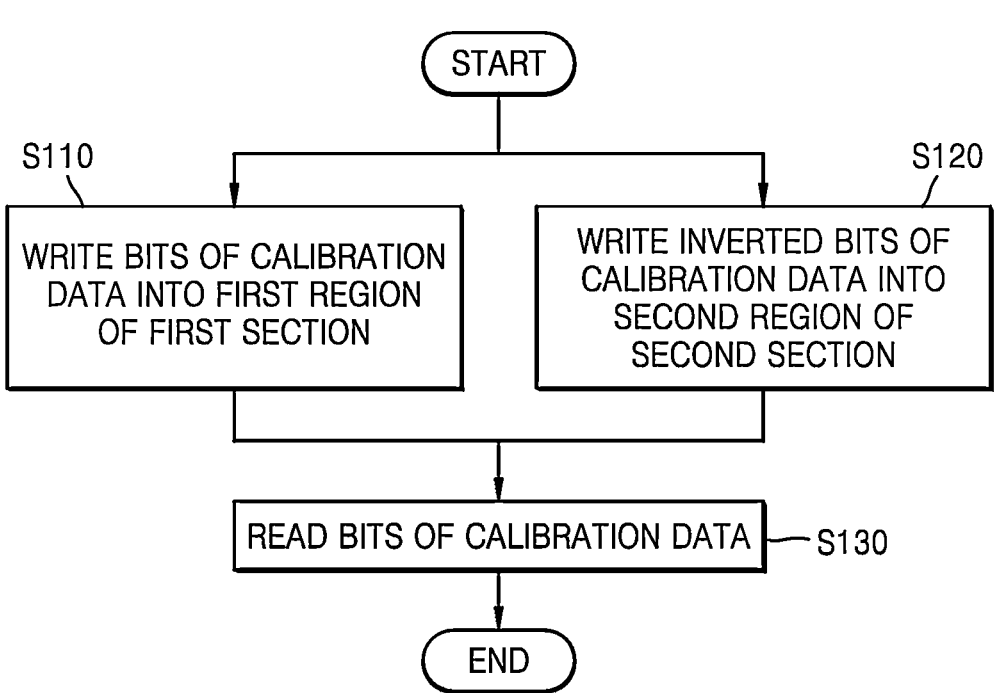
FIG. 9 is a flowchart of an operating method of a memory device, according to an embodiment.

FIG. 9 is a flowchart of an operating method of a memory device, according to an embodiment. The flowchart in FIG. 9 shows an operating method of a memory device that writes and reads calibration data. In some embodiments, the method of FIG. 9 may be performed in a calibration mode. As shown in FIG. 9, the operating method of the memory device may include a plurality of operations S110, S120, and S130. In some embodiments, the method of FIG. 9 may be performed by the memory device 50 in FIG. 5. Hereinafter, FIG. 9 is described with reference to FIG. 5.

Referring to FIG. 9, in operation S110, bits of calibration data may be written into a first region of the first section SEC1. The first region may include memory cells for storing calibration data in the first section SEC1, for example, memory cells connected to the second word line WL2. The row decoder 52 may activate the second word line WL2, and bits of calibration data may be written into the memory cell M12 connected to the second word line WL2 in the first section SEC1. An example of operation S110 is described below with reference to FIG. 10.

In operation S120, inverted bits of calibration data may be written into a second region of the second section SEC2. The second region may include memory cells for storing calibration data in the second section SEC2, for example, memory cells connected to the second word line WL2. The row decoder 52 may activate the second word line WL2, and inverted bits of calibration data may be written into the memory cell M22 connected to the second word line WL2 in the second section SEC2. An example of operation S120 is described below with reference to FIG. 10.

In some embodiments, as shown in FIG. 9, operations S110 and S120 may be performed in parallel. For example, operations S110 and S120 may be performed in parallel in response to one command CMD indicating a write operation. The memory device 50 may receive the address ADDR and the data DATA together with the command CMD. The address ADDR may correspond to the first region and the second region, and the data DATA may include bits and inverted bits of calibration data.

In some embodiments, unlike shown in FIG. 9, operations S110 and S120 may be sequentially performed. For example, the memory device 50 may receive the command CMD, the address ADDR, and the data DATA indicating a write operation. The address ADDR may correspond to the first region, and the data DATA may include bits of calibration data. Next, the memory device 50 may receive the command CMD, the address ADDR, and the data DATA indicating a write operation. The address ADDR may correspond to the second region, and the data DATA may include inverted bits of calibration data.

In operation S130, bits of calibration data may be read. For example, the memory device 50 may receive the command CMD indicating a read operation, and the address ADDR corresponding to the first region and the second region. The memory device 50 may determine bits of calibration data by simultaneously detecting bits stored in the first region in operation S110 and inverted bits stored in the second region in operation S120 and output bits of the calibration data. Examples of operation S130 are described below with reference to FIGS. 10 and 11. Subsequently, the calibration data can be used for calibrating a cell array of a memory device, for example by setting a resistance of a variable resistor used during normal read operations.

Figure 10:
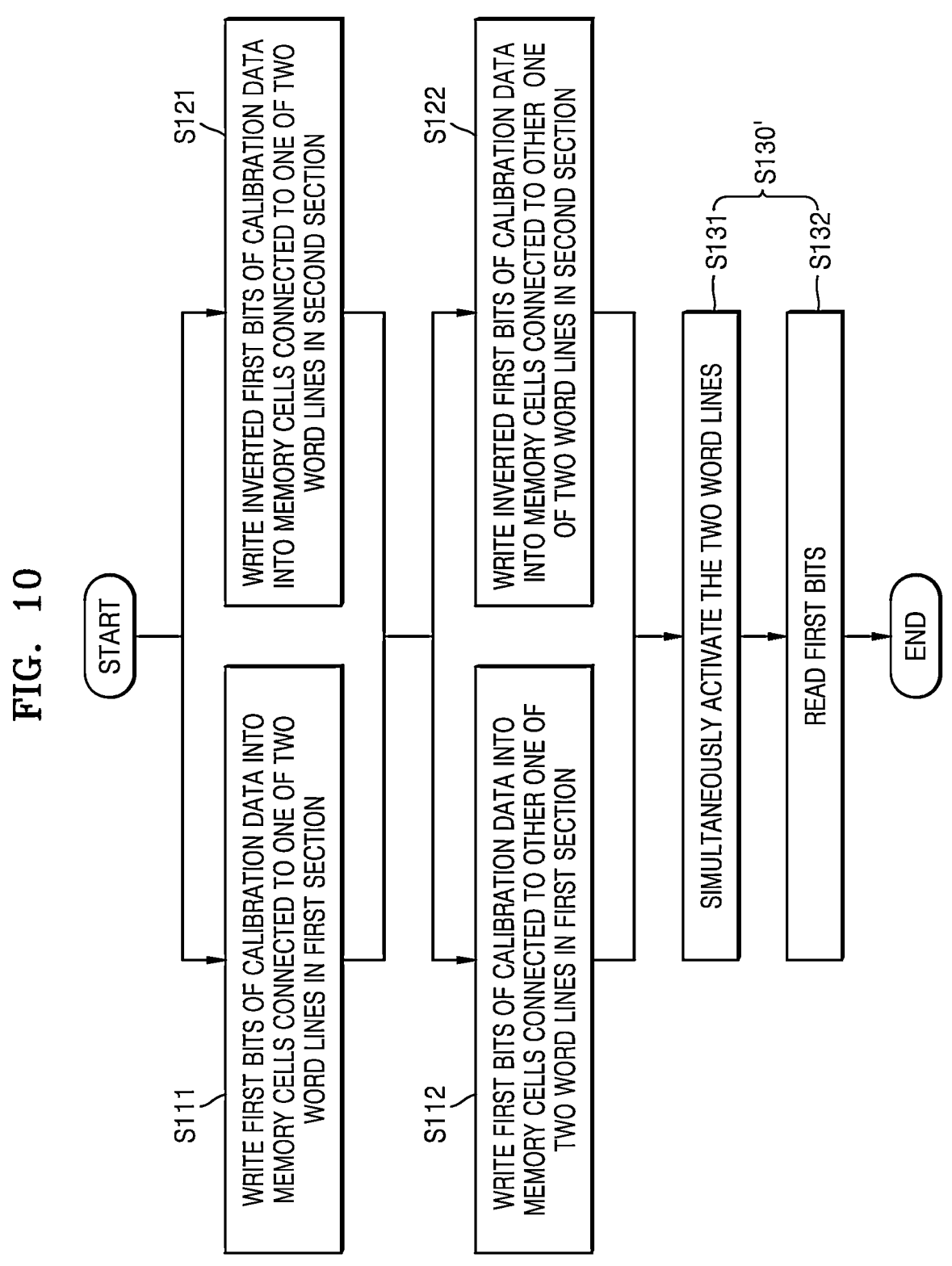
FIG. 10 is a flowchart of an operating method of a memory device, according to an embodiment.

FIG. 10 is a flowchart of an operating method of a memory device, according to an embodiment. For example, the flowchart in FIG. 10 shows an operating method of a memory device that writes and reads calibration data. As shown in FIG. 10, the operating method of a memory device may include a plurality of operations S111, S112, S121, S122, and S130', and operation S130' may include operations S131 and S132. In some embodiments, operations S111 and S112 in FIG. 10 may be included in operation S110 in FIG. 9, operations S121 and S122 in FIG. 10 may be included in operation S120 in FIG. 9, and operation S130' in FIG. 10 may be an example of operation S130 in FIG. 9. In some embodiments, the method of FIG. 10 may be performed by the memory device 70a in FIG. 7A. Hereinafter, FIG. 10 is described with reference to FIG. 7A, and descriptions of FIG. 10 that are the same as those of FIG. 7A provided with reference to the drawings are omitted.

Referring to FIG. 10, in operation S111, first bits of calibration data may be written into memory cells connected to one of two word lines in the first section SEC1. For example, the row decoder 72 may activate the word line WL21, and a first bit of calibration data may be written into the memory cell M121 connected to the word line WL21 in the first section SEC1.

In operation S121, first inverted bits of calibration data may be written into memory cells connected to one of two word lines in the second section SEC2. For example, the row decoder 72 may activate the word line WL21, and a first inverted bit of calibration data may be written into the memory cell M221 connected to the word line WL21 in the second section SEC2.

In operation S112, first bits of calibration data may be written into memory cells connected to the other one of two word lines in the first section SEC1. For example, the row decoder 72 may activate the word line WL22, and a first bit of calibration data may be written into the memory cell M122 connected to the word line WL22 in the first section SEC1.

In operation S122, first inverted bits of calibration data may be written into memory cells connected to the other one of two word lines in the second section SEC2. For example, the row decoder 72 may activate the word line WL22, and a first inverted bit of calibration data may be written into the memory cell M222 connected to the word line WL22 in the second section SEC2.

In some embodiments, as shown in FIG. 10, operations S111 and S121 may be performed in parallel and operations S112 and S122 may be performed in parallel. In some embodiments, unlike shown in FIG. 10, operations S111, S121, S112, and S122 may be performed independently of each other.

In operation S131, two word lines of a set of word lines connected to memory cells storing calibration data may be simultaneously activated. For example, the memory device 70a may receive the command CMD indicating a read operation, and the address ADDR corresponding to two word lines. The row decoder 72 may simultaneously activate two word lines WL21 and WL22, and accordingly, the memory cells M121 and M122 of the first section SEC1 and the memory cells M221 and M222 of the second section SEC2 may be simultaneously selected.

In operation S132, first bits may be read. For example, the read circuit 75 may compare a current passing through the memory cells M121 and M122 of the first section SEC1 to a current passing through the memory cells M221 and M222 of the second section SEC2 and determine a first bit corresponding to the comparison result. The read circuit 75 may output a data signal D_OUT including the determined first bit.

Figure 11:
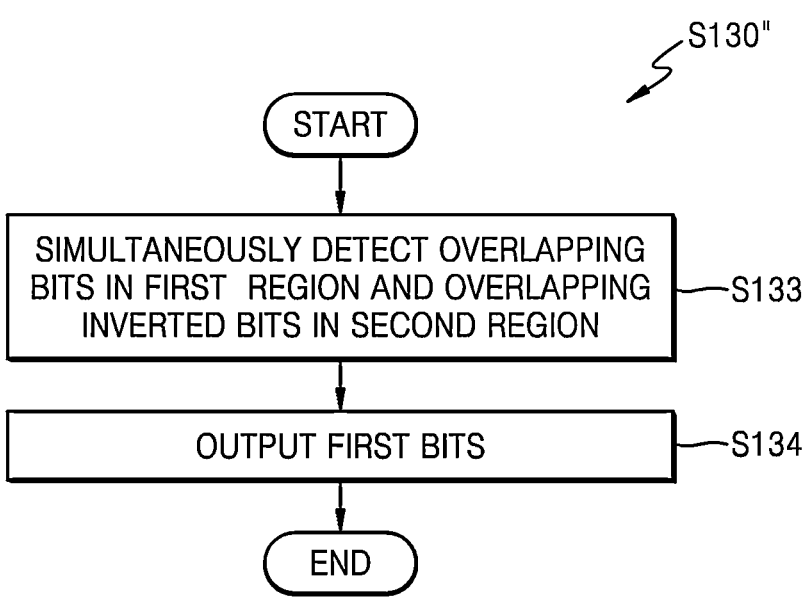
FIG. 11 is a flowchart of an operating method of a memory device, according to an embodiment.

FIG. 11 is a flowchart of an operating method of a memory device, according to an embodiment. For example, the flowchart of FIG. 11 shows an example of operation S130 in FIG. 9. As described above with reference to FIG. 9, bits of calibration data may be read in operation S130'' in FIG. 11. As shown in FIG. 11, operation S130'' may include operations S133 and S134. In some embodiments, operation S130'' in FIG. 11 may be performed by the memory device 70b in FIG. 7B. Hereinafter, FIG. 11 is described with reference to FIG. 7B, and descriptions of FIG. 11 that are the same as those of FIG. 7B provided with reference to the drawings are omitted.

Referring to FIG. 11, in operation S133, duplicated bits in the first region and duplicated inverted bits in the second region may be simultaneously detected. For example, the memory device 70b may receive the command CMD indicating a read operation, and the address ADDR and the data DATA corresponding to the first region and/or the second region. The data DATA may include duplicated bits, and the duplicated bits may be respectively written into the memory cells M121 and M122 of the first section SEC1 commonly connected to the second word line WL2. In addition, the duplicated inverted bits may be respectively written into the memory cells M221 and M222 of the second section SEC2 commonly connected to the second word line WL2. For example, the memory device 70b may receive the command CMD indicating a read operation, and the address ADDR corresponding to the first region and/or the second region. The row decoder 72 may activate the second word line WL2. The first column decoder 73 may select two bit lines BL12 and BL13, and the second column decoder 74 may select two bit lines BL22 and BL23. The read circuit 75 may simultaneously detect and compare the sum of currents passing through the memory cells M121 and M122 of the first section SEC1 to the sum of currents passing through the memory cells M221 and M222 of the second section SEC2 and determine a first bit corresponding to the comparison result. The read circuit 75 may output a data signal D_OUT including the determined first bit.

Figure 12:
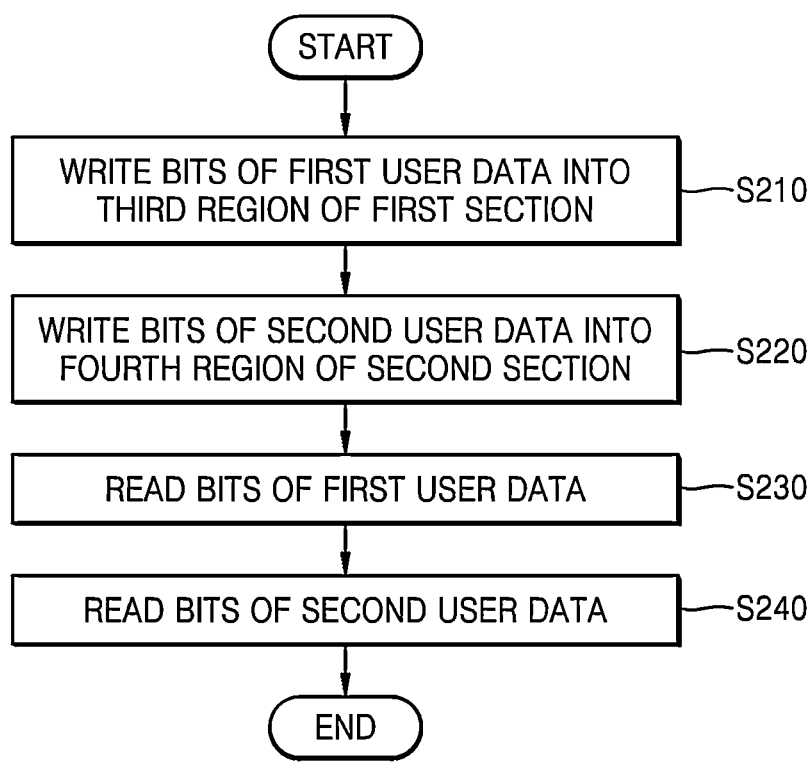
FIG. 12 is a flowchart of an operating method of a memory device, according to an embodiment.

FIG. 12 is a flowchart of an operating method of a memory device, according to an embodiment. For example, the flowchart in FIG. 12 shows an operating method of a memory device for writing and reading user data. In some embodiments, the method of FIG. 12 may be performed in a normal mode. As shown in FIG. 12, the operating method of the memory device may include a plurality of operations S210, S220, S230, and S240. In some embodiments, the method of FIG. 12 may be performed by the memory device 40 in FIGS. 4A and 4B. Hereinafter, FIG. 12 is described with reference to FIGS. 4A and 4B.

Referring to FIG. 12, in operation S210, bits of first user data may be written into a third region of the first section SEC1. The third region may include memory cells for storing user data in the first section SEC1, for example, memory cells connected to the first word line WL1. The row decoder 42 may activate the first word line WL1, and bits of first user data may be written into the memory cell M11 connected to the first word line WL1 in the first section SEC1.

In operation S220, bits of second user data may be written into a fourth region of the second section SEC2. The fourth region may include memory cells for storing user data in the second section SEC2, for example, memory cells connected to the first word line WL1. The row decoder 42 may activate the first word line WL1, and bits of the second user data may be written into the memory cell M21 connected to the first word line WL1 in the second section SEC2.

In some embodiments, as shown in FIG. 12, operations S210 and S220 may be sequentially performed. For example, the memory device 40 may receive the command CMD, the address ADDR, and the data DATA indicating a write operation. The address ADDR may correspond to the third region, and the data DATA may include bits of the first user data. Next, the memory device 40 may receive the command CMD, the address ADDR, and the data DATA indicating a write operation. The address ADDR may correspond to the fourth region, and the data DATA may include bits of the second user data.

In some embodiments, unlike shown in FIG. 12, operations S210 and S220 may be performed in parallel. For example, operations S210 and S220 may be performed in parallel in response to one command CMD indicating a write operation. The memory device 40 may receive the address ADDR and the data DATA together with the command CMD. The address ADDR may correspond to the third region and the fourth region, and the data DATA may include bits of the first user data and bits of the second user data.

In operation S230, bits of the first user data may be read. For example, the memory device 40 may receive the command CMD indicating a read operation, and the address ADDR corresponding to the third region. The read circuit 45 may determine a bit of the first user data stored in the memory cell M11 based on the memory cell M11 of the first section SEC1 and the reference cell R21 of the second section SEC2 and generate a data signal D_OUT including the determined bit.

In operation S240, bits of the second user data may be read. For example, the memory device 40 may receive the command CMD indicating a read operation, and the address ADDR corresponding to the fourth region. The read circuit 45 may determine a bit of the second user data stored in the memory cell M21, based on the memory cell M21 of the second section SEC2 and the reference cell R11 of the first section SEC1, and generate a data signal D_OUT including the determined bit.

In some embodiments, operations S230 and S240 may be sequentially performed in response to one command CMD indicating a read operation. For example, the address ADDR received together with the command CMD may correspond to the third region and the fourth region, and the memory device 40 may read a value stored in the memory cell M21 of the second section SEC2 after reading a value stored in the memory cell M11 of the first section SEC1.

Figure 13:
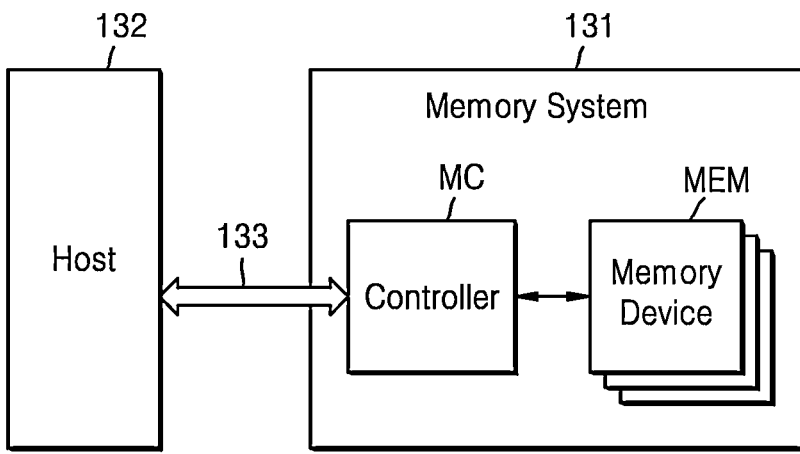
FIG. 13 is a block diagram of a memory system including a memory device, according to an embodiment.

FIG. 13 is a block diagram of a memory system 131 including a memory device, according to an embodiment. As shown in FIG. 13, the memory system 131 may communicate with a host 132 and may include a controller MC and a memory device MEM.

An interface 133 communicating with the memory system 131 and the host 132 may use an electrical signal and/or an optical signal and may be implemented as, as non-limiting examples, a serial advanced technology attachment (SATA) interface, SATA express (SATAe) interface, serial attached small computer system interface (serial attached SCSI; SAS), peripheral component interconnect express (PCIe) interface, non-volatile memory express (NVMe) interface, universal flash storage (UFS) interface, advanced host controller interface (AHCI), or a combination of two or more of the same.

In some embodiments, the memory system 131 may communicate with the host 132 by being removably coupled to the host 132. As a resistive memory, the memory device MEM may be a non-volatile memory, and the memory system 131 may also be referred to as a storage system. For example, the memory system 131 may be implemented as, as non-limiting examples, a solid-state drive or solid-state disk (SSD), embedded SSD (eSSD), multimedia card (MMc), embedded multimedia card (eMMC), or the like.

The controller MC may control the memory device MEM in response to a request received from the host 132 via the interface 133. For example, in response to a write request, the controller MC may write data received along with the write request into the memory device MEM, and in response to a read request, the controller MC may provide data stored in the memory device MEM to the host 132.

The memory system 131 may include at least one memory device MEM, and the memory device MEM may include a memory cell and a reference cell having a variable resistance element. As described above with reference to the drawings, the memory device MEM may store calibration data for calibrating the memory device MEM in a cell array, and when power is supplied to the memory system 131, the controller MC or the memory device MEM may read calibration data, and set the memory device MEM based on the calibration data. Accordingly, a separate storage device for storing calibration data may be omitted. During operation, the controller MC may further include control circuitry configured to control the memory device MEM to perform the various read, write, and calibration operations described in connection with FIGS. 1-12, for example, in response to commands received from the host 132. Therefore, the memory device MEM as well as the memory system 131 may be configured to perform the various read, write, and calibration operations described herein.

Figure 14:
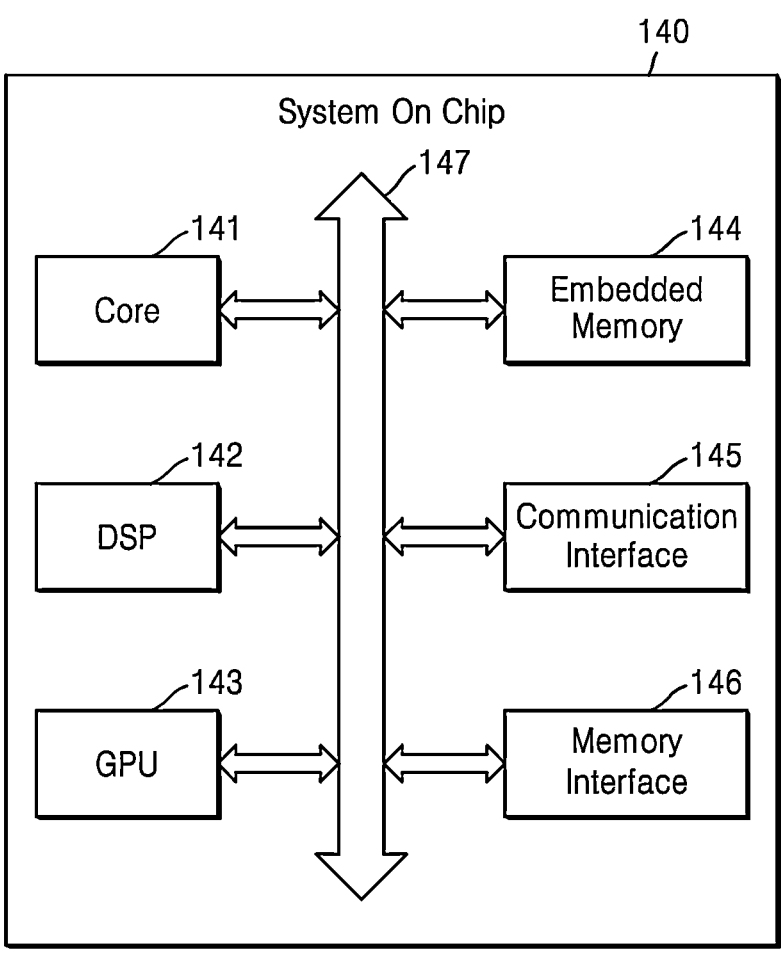
FIG. 14 is a block diagram of a system-on-chip including a memory device, according to an embodiment.

FIG. 14 is a block diagram of a system-on-chip 140 including a memory device, according to an embodiment. The SoC 140 may refer to an integrated circuit that integrates components of a computing system or other electronic system. For example, as one of the SoC 140, an application processor (AP) may include a processor and components for other functions. As shown in FIG. 14, the SoC 140 may include a core 141, a digital signal processor (DSP) 142, a graphics processing unit (GPU) 143, a built-in memory 144, a communication interface 145, and a memory interface 146. Elements of the SoC 140 may communicate with each other via a bus 147.

The core 141 may process instructions and control operations of elements included in the SoC 140. For example, the core 141 may process a series of instructions and drive an operating system, and execute applications on the operating system. The DSP 142 may generate useful data by processing a digital signal, for example, a digital signal provided from the communication interface 145. The GPU 143 may generate data for an image output through a display device from image data provided from the built-in memory 144 or the memory interface 146, and encode the image data.

The built-in memory 144 may store data necessary for the core 141, the DSP 142, and the GPU 143 to operate. The built-in memory 144 may include a memory device according to an embodiment, and accordingly, a storage device for storing calibration data of a memory device may be omitted in the SoC 140. The communication interface 145 may provide an interface for a communication network or one-to-one communication. The memory interface 146 may provide an interface to external memory of the SoC 140, for example, dynamic random access memory (DRAM) and flash memory.

While the inventive concept has been particularly shown and described with reference to embodiments thereof, it will be understood that various changes in form and details may be made therein without departing from the spirit and scope of the following claims.

What is claimed is:

1. A memory device comprising:

a cell array comprising a first section and a second section that share a plurality of word lines comprising a first set of word lines and a second set of word lines;

a first column decoder configured to select at least one bit line of a first set of bit lines connected to the first section;

a second column decoder configured to select at least one bit line of a second set of bit lines connected to the second section;

a read circuit configured to output a data signal based on a comparison between an output of the first column decoder and an output of the second column decoder; and a variable resistor circuit connected to the read circuit, wherein the first section comprises a plurality of first memory cells connected to at least one word line from the first set of word lines and configured to store bits of calibration data for calibrating the memory device, wherein the second section comprises a plurality of second memory cells connected to the at least one word line and configured to store inverted bits of the bits of calibration data, wherein the first section further comprises a plurality of third memory cells connected to the second set of word lines and configured to store first user data, wherein the second section further comprises a plurality of fourth memory cells connected to the second set of word lines and configured to store second user data, and wherein the read circuit is configured to read data from the plurality of third memory cells and from the plurality of fourth memory cells using the variable resistor circuit, and a resistance provided by the variable resistor circuit is controlled based on the calibration data and the inverted bits of the bits of calibration data stored in the plurality of first memory cells and the plurality of second memory cells respectively.

2. The memory device of claim 1, further comprising an address decoder configured to provide, as part of the calibration data being read, column addresses corresponding to each other to the first column decoder and the second column decoder, respectively.

3. The memory device of claim 1, wherein:

the first section further comprises a plurality of first reference cells connected to the second set of word lines, and the second section further comprises a plurality of second reference cells connected to the second set of word lines.

4. The memory device of claim 3, wherein:

the first column decoder is configured to select, as part of the second user data being read, a first bit line connected to the plurality of first reference cells from among the first set of bit lines, and the second column decoder is configured to select, as part of the first user data being read, a second bit line connected to the plurality of second reference cells from among the second set of bit lines.

5. The memory device of claim 3, wherein the read circuit is configured to electrically connect, as part of the first user data being read, the variable resistor circuit to a second bit line connected to the plurality of second reference cells from among the second set of bit lines, and electrically connect, as part of the second user data being read, the variable resistor circuit to a first bit line connected to the plurality of first reference cells from among the first set of bit lines.

6. The memory device of claim 5, wherein the read circuit is configured to electrically disconnect, as part of the calibration data being read, the variable resistor circuit from the first set of bit lines and the second set of bit lines.

7. The memory device of claim 1, wherein:

the memory device further comprises a row driver configured to simultaneously activate, as part of the calibration data being read, two or more word lines from among the first set of word lines.

8. The memory device of claim 1, wherein:

the first column decoder is configured to simultaneously select, as part of the calibration data being read, two or more bit lines from among the first set of bit lines, and the second column decoder is configured to simultaneously select, as part of the calibration data being read, two or more second bit lines from among the second set of bit lines.

9. A memory device comprising:

a cell array comprising a first section and a second section that share a plurality of word lines;

a first column decoder connected to the first section through a first set of bit lines of a plurality of bit lines;

a second column decoder connected to the second section through a second set of bit lines of the plurality of bit lines;

a read circuit configured to output a data signal based on a comparison between an output of the first column decoder and an output of the second column decoder;

an address decoder configured to provide, when a calibration data for calibrating the memory device is read, column addresses corresponding to each other to the first column decoder and the second column decoder, respectively; and a variable resistor circuit connected to the read circuit, wherein:

the first section comprises a plurality of first memory cells connected to at least one word line of a first set of word lines from among the plurality of word lines and configured to store bits of the calibration data, the second section comprises a plurality of second memory cells connected to the at least one word line and configured to store inverted bits of the bits of calibration data, the first section further comprises a plurality of third memory cells connected to a second set of word lines from among the plurality of word lines and configured to store first user data, the second section further comprises a plurality of fourth memory cells connected to the second set of word lines and configured to store second user data, and the resistance provided by the variable resistor circuit is controlled based on the bits of the calibration data stored in the plurality of first memory cells and the inverted bits of the bits of calibration data stored in the plurality of second memory cells.

10. An operating method of a memory device, wherein the memory device comprises a cell array comprising a first section and a second section that share a plurality of word lines, the operating method comprising:

writing, in response to at least one first write command, bits of calibration data for calibrating the memory device into a first region of the first section, and writing inverted bits of the bits of calibration data into a second region of the second section;

reading bits of the calibration data by simultaneously detecting, in response to a first read command, bits stored in the first region and inverted bits stored in the second region;

writing, in response to at least one second write command, bits of first user data into a third region of the first section and bits of second user data into a fourth region of the second section;

using the bits of calibration data and the inverted bits of the bits of calibration data to control a variable resistor circuit connected to a read circuit for reading the first user data and the second user data; and reading the first user data and the second user data using the bits of calibration data and the inverted bits of the bits of calibration data stored in the first region of the first section and second region of the second section respectively.

11. The operating method of claim 10, wherein:

the first region and the second region share at least one word line from among the plurality of word lines, and the reading of the bits of the calibration data comprises activating the at least one word line.

12. The operating method of claim 10, wherein:

each of the first section and the second section includes a reference cell, and the operating method further comprises:

reading, in response to a second read command, a bit of the first user data based on a bit stored in the third region and the reference cell of the second section; or reading, in response to the second read command, a bit of the second user data based on bits stored in the fourth region and the reference cell of the first section.

13. The operating method of claim 12, wherein:

the memory device is configured to be set to a calibration mode or to a normal mode, the at least one first write command and the first read command are received in the calibration mode, and the at least one second write command, the second read command, and a third read command are received in the normal mode.

14. The operating method of claim 10, wherein:

the writing of the bits of the calibration data comprises:

writing first bits of the calibration data into memory cells connected to a first word line from among the plurality of word lines in the first section; and writing the first bits into memory cells connected to a second word line from among the plurality of word lines in the first section, and the writing of the inverted bits comprises:

writing first inverted bits of a first set of bits of the calibration data into memory cells in the second section connected to the first word line; and writing the first inverted bits into memory cells in the second section connected to the second word line.

15. The operating method of claim 14, wherein the reading of the bits of the calibration data comprises simultaneously activating the first word line and the second word line.

16. The operating method of claim 10, wherein:

the bits of the calibration data comprise duplicated bits, the inverted bits of the bits of calibration data comprise duplicated inverted bits, and the reading of the bits of the calibration data comprises simultaneously detecting duplicated bits stored in two or more memory cells of the first region and duplicated inverted bits stored in two or more memory cells of the second region.

* * * * *